(12) United States Patent
Hong et al.

(10) Patent No.: US 8,385,098 B2
(45) Date of Patent: Feb. 26, 2013

(54) FERROELECTRIC MEMORY DEVICES AND OPERATING METHODS THEREOF

(75) Inventors: Ki-ha Hong, Cheonan-si (KR); Jeong-seob Kim, Hwaseong-si (KR); Jai-kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 201 days.

(21) Appl. No.: 12/923,131

(22) Filed: Sep. 3, 2010

(65) Prior Publication Data

US 2011/0075467 A1      Mar. 31, 2011

(30) Foreign Application Priority Data

Sep. 25, 2009   (KR) .................. 10-2009-0091360

(51) Int. Cl.
*G11C 11/22* (2006.01)
(52) U.S. Cl. .................. 365/145; 365/218; 257/295
(58) Field of Classification Search .................. 365/145, 365/218, 185.03, 185.19, 185.22; 257/295, 257/255
See application file for complete search history.

(56) References Cited

U.S. PATENT DOCUMENTS

| | | |
|---|---|---|
| 6,459,118 B1 | 10/2002 | Kang |
| 6,952,361 B2 | 10/2005 | Gudesen et al. |
| 2004/0004887 A1 | 1/2004 | Gudesen et al. |
| 2005/0070032 A1 | 3/2005 | Richards et al. |
| 2006/0046317 A1 | 3/2006 | Bruchhaus et al. |
| 2007/0242511 A1* | 10/2007 | Chen et al. ............ 365/185.02 |
| 2008/0251816 A1* | 10/2008 | Tanaka et al. ............ 257/255 |
| 2009/0055573 A1* | 2/2009 | Ito ............ 711/102 |
| 2009/0228642 A1* | 9/2009 | Yano et al. ............ 711/103 |
| 2011/0205800 A1* | 8/2011 | Roohparvar ............ 365/185.17 |

FOREIGN PATENT DOCUMENTS

| | | |
|---|---|---|
| JP | 2000-340759 A | 12/2000 |
| JP | 2000-340760 A | 12/2000 |
| JP | 2008-0042114 A | 9/2009 |
| KR | 10-0281127 B1 | 6/2000 |
| KR | 10-2004-0111435 A | 12/2004 |
| KR | 1020070058573 | 6/2007 |

OTHER PUBLICATIONS

M.H. Tang et al., "Capacitance-voltage and retention characteristics of Pt/SrBi$_2$Ta$_2$O$_9$/HfO$_2$/Si structures with various buffer layer thickness", Applied Physics Letters 94, 212907-212907/3, May 29, 2009.
L. Liao et al., "Ferroelectric Transistors with Nanowire Channel: Toward Nonvolatile Memory Applications", ACS /NANO, Article ASAP Publication date Feb. 27, 2009, Downloaded from http://pubs.acs.org on Mar. 16, 2009, pp. A-G.
Yi Zheng et al., "Gate-controlled non-volatile graphene-ferroelectric memory", pp. 1-4, (arXiv:0904.1326v2 [cond.mat.mes-hall]) Apr. 23, 2009.

(Continued)

*Primary Examiner* — Dang Nguyen
(74) *Attorney, Agent, or Firm* — Harness, Dickey & Pierce, P.L.C.

(57) ABSTRACT

A ferroelectric memory device having a NAND array of a plurality of ferroelectric memory cells includes: a fully depleted channel layer; a gate electrode layer; and a ferroelectric layer located between the channel layer and the gate electrode layer. The data of the plurality of ferroelectric memory cells is erased by applying a first erase voltage to a bit line and a common source line and applying a second erase voltage to a string selection line and a ground selection line.

24 Claims, 15 Drawing Sheets

OTHER PUBLICATIONS

Wangyang Fu et al., "Intrinsic Memory Function of Carbon Nanotube-based Ferroelectric Field-Effect Transistor", NANO Letters, vol. 9, No. 3, 921-925, Feb. 10, 2009.

Ken Takeuchi, "Solid-State Drive(SSD) and Memory System Innovation", University of Tokyo, INRETS Joint Symposium, pp. 1-55, Jul. 7, 2008.

* cited by examiner

FERROELECTRIC MEMORY DEVICES AND OPERATING METHODS THEREOF

CROSS-REFERENCE TO RELATED APPLICATION(S)

This application claims priority under 35 U.S.C. §119 to Korean Patent Application No. 10-2009-0091360, filed on Sep. 25, 2009, in the Korean Intellectual Property Office, the entire contents of which are incorporated herein by reference.

BACKGROUND

1. Field

Example embodiments relate to ferroelectric memory devices and operating methods thereof, and more particularly, to ferroelectric memory devices having reduced interference between cells, increased scalability, and/or a stack structure, and operating methods thereof.

2. Description of the Related Art

With the development of the semiconductor industry, memory devices having a higher density per unit area are generally in demand. Ferroelectric memories are nonvolatile memory devices including a ferroelectric material in a capacitor portion.

Operating principles of ferroelectric memory devices are similar to that of flash memory devices. However, in flash memory devices the concentration of electrons of a floating gate or a charge trap layer causes a shift in a threshold voltage Vth, whereas the threshold voltage in the ferroelectric memory device is shifted according to the polarization direction of the ferroelectric layer.

Nonvolatile memory devices such as electrically erasable programmable read-only memories (EEPROMs) and flash memory devices retain data even if power is cut-off. These types of nonvolatile memories are also capable of programming new data while erasing stored data. Nonvolatile memory devices may be used for semiconductor products such as storage media for mobile devices or portable memory sticks.

With the recent trend in miniaturization of semiconductor products, nonvolatile memory devices included in semiconductor products are becoming more highly integrated. For example, nonvolatile memory apparatuses in which the nonvolatile memory devices are stacked in a three dimensional (3-D) structure may have a relatively high degree of integration in the same plane as compared to nonvolatile memory apparatuses in which the nonvolatile memory devices are stacked in a two-dimensional plane structure.

SUMMARY

Example embodiments provide ferroelectric memory device, which may reduce interference between cells, increase scalability, and/or enable a stack structure, and an operating method thereof.

At least one example embodiment provides a ferroelectric memory device having a NAND array of a plurality of ferroelectric memory cells. According to at least this example embodiment, the ferroelectric memory device includes: a fully depleted channel layer; a gate electrode layer; and a ferroelectric layer located between the channel layer and the gate electrode layer.

According to at least some example embodiments, each of the plurality of memory cells corresponds to a unit area including the channel layer, the ferroelectric layer, and a gate electrode. The ferroelectric layer may be formed continuously relative to the plurality of memory cells. The device may further include: a separation layer and a thin screening dielectric. The separation layer may be formed between the gate electrodes of each pair of neighboring memory cells. The thin screening dielectric may be located between the channel layer and the ferroelectric layer in an area corresponding to each separation region to reduce interference between memory cells.

The channel layer and the gate electrode layer may cross each other in a plurality of areas. The channel layer may extend along a bit line, whereas the gate electrode layer may extend along a word line. The ferroelectric layer may be formed continuously along the bit line and each of the plurality of memory cells may correspond to the area in which the channel layer and the gate electrode layer cross each other.

Each of the plurality of memory cells may correspond to a unit area including the channel layer, the ferroelectric layer, and a gate electrode. The ferroelectric layer may be formed continuously relative to the plurality of memory cells. The device may further include: a separation region and a low-dielectric region. The separation region may be formed between the gate electrodes of each pair of neighboring memory cells. The low-dielectric region may be provided in the ferroelectric layer at a position corresponding to each separation region to reduce interference between neighboring memory cells.

The low-dielectric region may be formed by filling a portion of the ferroelectric layer with a low-dielectric material or implanting a material capable of lowering a dielectric constant of the ferroelectric layer.

Each of the plurality of memory cells may correspond to a unit area including the channel, a portion of the ferroelectric layer, and a gate electrode. The device may further include a separation region formed between each pair of neighboring memory cells. The separation region may separate the portions of the ferroelectric layer of each pair of neighboring memory cells and may separate the gate electrodes of each pair of neighboring memory cells.

The channel layer, the gate electrode layer, and the ferroelectric layer may be stacked sequentially in order of the channel layer, the ferroelectric layer, and the gate electrode layer, or the gate electrode layer, the ferroelectric layer, and the channel layer. The channel layer, the ferroelectric layer, and the gate electrode layer may be arranged in one of a single layer and a multi-layer structure.

The channel layer may be formed of at least one of silicon (Si), germanium (Ge), polysilicon, conductive oxide, carbon nano tube (CNT), nanowire, and graphene.

At least one other example embodiment provides a method of operating a ferroelectric memory device having a NAND array of a plurality of ferroelectric memory cells. The ferroelectric memory cells include: a fully depleted channel layer; a gate electrode layer; and a ferroelectric layer located between the channel layer and the gate electrode layer. The ferroelectric memory device further includes: a string selection transistor between a bit line and a common source line, and a ground selection transistor. According to at least this example embodiment, the method includes: erasing data of the plurality of ferroelectric memory cells by applying a first erase voltage to the bit line and the common source line and applying a second erase voltage to a string selection line and a ground selection line.

According to at least some example embodiments, the method may further include: inverting the channel layer by applying first and second inversion voltages to the bit line and the common source line and applying a pass voltage to the string selection line and the ground selection line; and erasing data of the plurality of ferroelectric memory cells after inverting the channel layer.

According to at least some example embodiments, the pass voltage may be applied to the plurality of ferroelectric memory cells during the channel layer inversion.

In the erasing of data, a ground voltage may be applied to the plurality of ferroelectric memory cells.

BRIEF DESCRIPTION OF THE DRAWINGS

Example embodiments will become more apparent and readily appreciated from the following description of the accompanying drawings in which.

DETAILED DESCRIPTION

Figure 1:
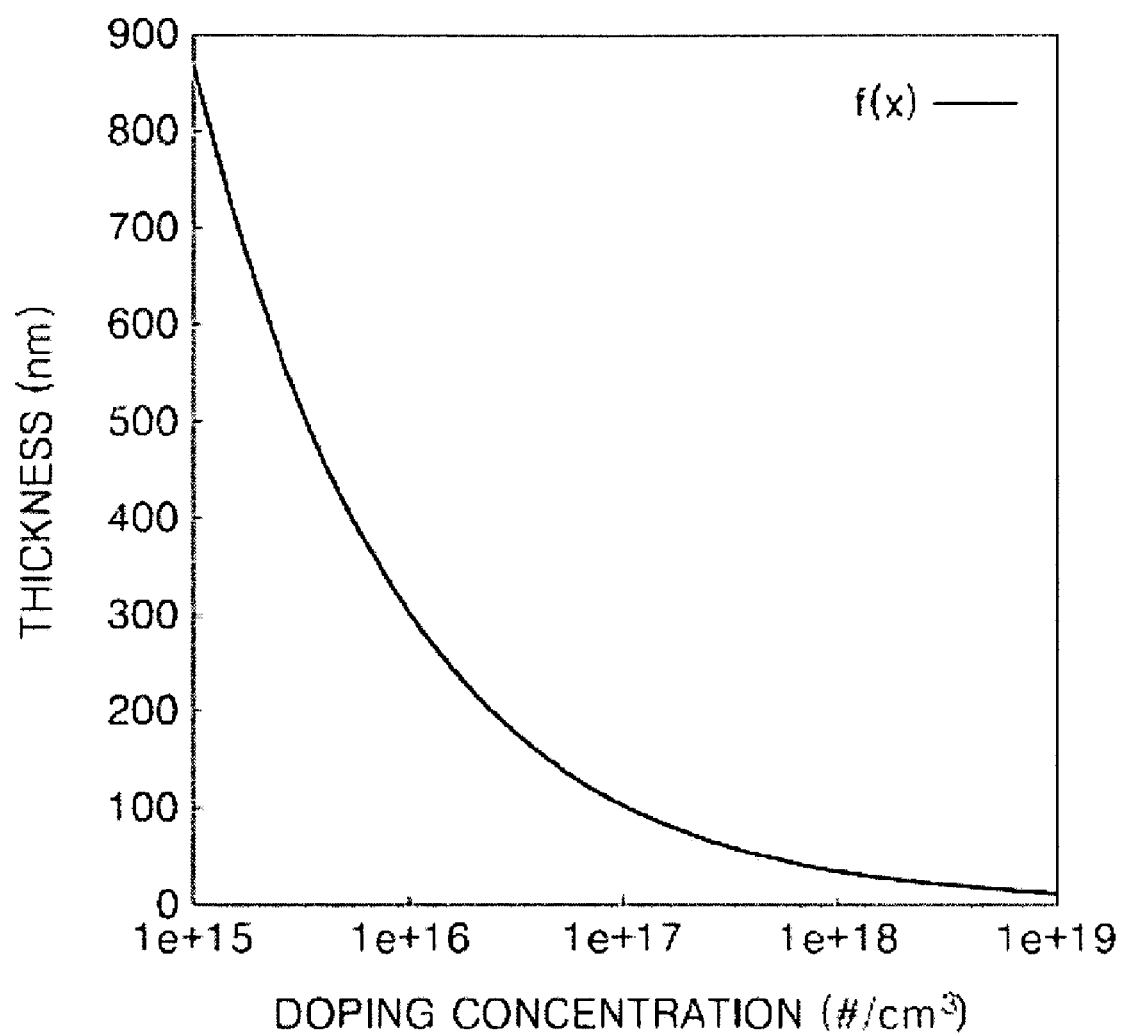
FIG. 1 is a graph showing an example change in depletion width according to doping concentration of a channel.

Detailed illustrative example embodiments are disclosed herein. However, specific structural and functional details disclosed herein are merely representative for purposes of describing example embodiments. General inventive concepts of example embodiments may, however, be embodied in many alternate forms and should not be construed as limited to only the example embodiments set forth herein.

Accordingly, while general inventive concepts are capable of various modifications and alternative forms, embodiments thereof are shown by way of example in the drawings and will herein be described in detail. It should be understood, however, that there is no intent to limit example embodiments to the particular forms disclosed, but on the contrary example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or," includes any and all combinations of one or more of the associated listed items.

When an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (for example, "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

Figure 2:
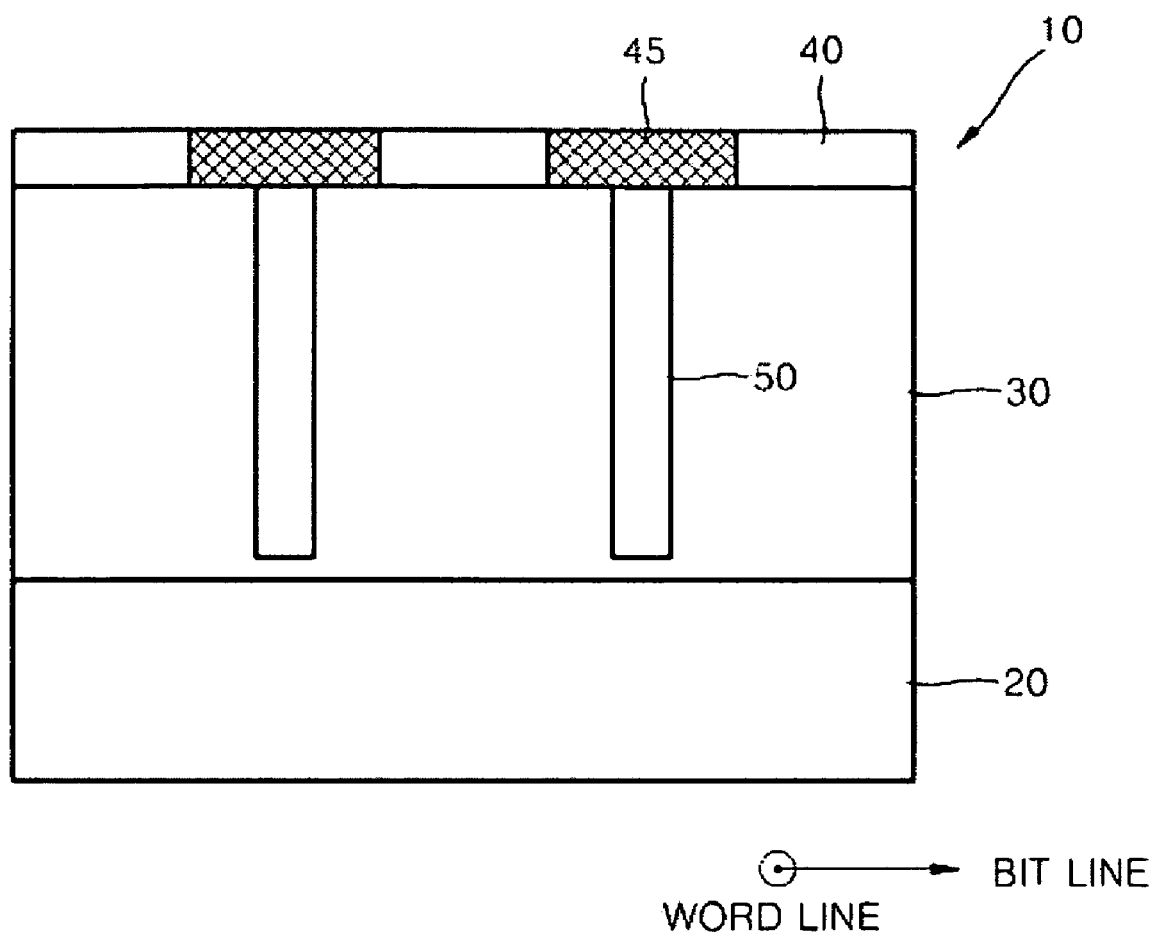
FIG. 2 schematically illustrates a ferroelectric memory device according to an example embodiment.
Figure 4:
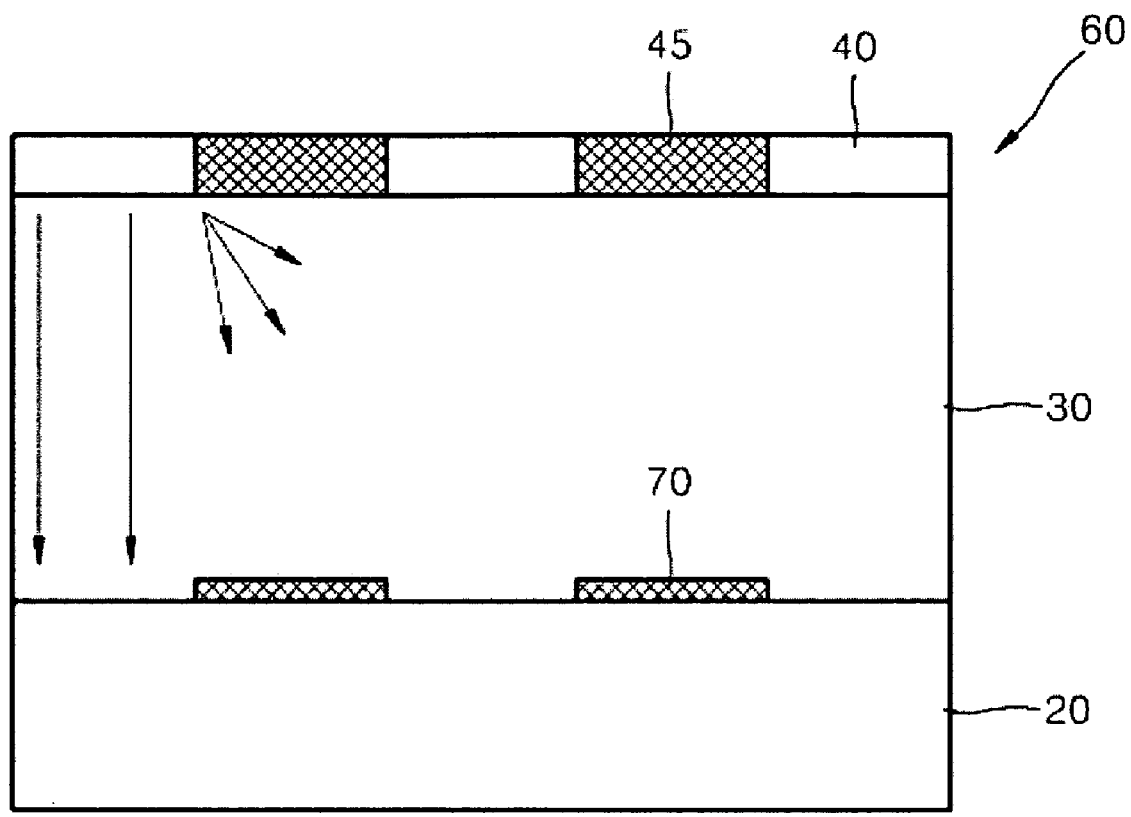
FIG. 4 schematically illustrates a ferroelectric memory device according to another example embodiment.
Figure 7:
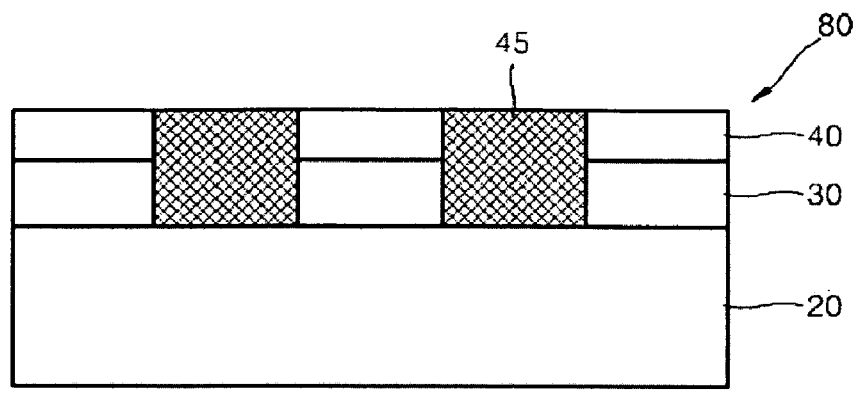
FIG. 7 schematically illustrates a ferroelectric memory device according to another example embodiment.

Referring to FIGS. 2, 4, and 7, a ferroelectric memory device according to each of various example embodiments includes: a fully depleted channel; a gate electrode; and a ferroelectric layer located between the channel and the gate electrode. Because a ferroelectric memory device according to at least one example embodiment includes the fully depleted channel, a source/drain region between memory cells is formed by a field effect rather than by impurity doping. Also, ferroelectric memory devices according to example embodiments may have a structure without a substrate electrode to implement a stacked NAND structure.

To form a channel having a thickness enabling full depletion, the thickness of the channel is smaller than a depletion width. The thickness of a fully depleted channel may be changed according to the material of a channel, channel doping, and/or the structure of a device.

For example, according to page 67 of "Fundamentals of Modern VLSI Devices," by Y. Taur, in the case of silicon a depletion width $W_{dm}$ is defined by doping concentration $N_a$, intrinsic carrier density $n_i$, and silicon dielectric constant $\in_{si}$, as shown in Equation 1 below.

$$W_{dm} = \sqrt{\frac{4\varepsilon_{si}kT\ln(N_a/n_i)}{q^2 N_a}} \quad \text{[Equation 1]}$$

FIG. 1 shows an example change in depletion width according to the doping concentration of a channel. To form a fully depleted channel, a channel thickness smaller than the depletion width is used considering the channel doping concentration.

Ferroelectric memory devices according to at least some example embodiments include a fully depleted channel so that a source/drain region between memory cells may be defined by a field effect rather than impurity doping. For example, ferroelectric memory devices according to at least one example embodiment includes: a channel, a gate electrode, and a ferroelectric layer. In this example, a fringe field created by a voltage applied through the gate electrode produces a doping effect by affecting a fully depleted channel region between memory cells. Accordingly, additional doping for the source/drain region is not needed. The source/drain region formed in the channel region between memory cells by the field effect may be modulated according to the voltage applied to the gate electrode.

FIG. 2 schematically illustrates a ferroelectric memory device according to an example embodiment.

Referring to FIG. 2, the ferroelectric memory device 10 includes: a channel 20; a gate electrode 40; and a ferroelectric layer 30 located between the channel 20 and the gate electrode 40. As discussed herein, the channel 20 may also be referred to as a channel layer 20. Similarly, the gate electrode 40 may be referred to as a gate electrode layer 40.

A unit area or unit cell including the channel 20, the ferroelectric layer 30, and the gate electrode 40, for example, corresponds to a ferroelectric memory cell $T_M$ of a NAND ferroelectric memory apparatus described below with regard to FIG. 12. In an actual ferroelectric memory apparatus, a plurality of ferroelectric memory cells are arranged in first and second directions (e.g., in a bit line direction and a word line direction, respectively) forming a two dimensional array.

In a NAND structure, for example, the channels 20 are formed (e.g., continuously) in the bit line direction, but formed discontinuously and separated from each other in the word line direction. The gate electrodes 40 are formed (e.g., continuously) in the word line direction, but discontinuously and separated from each other in the bit line direction. The channels 20 and the gate electrodes 40 cross each other in a plurality of areas. A given ferroelectric memory cell corresponds to an area where the channel 20 and the gate electrode 40 cross each other and has a stack layer structure including the channel 20, the ferroelectric layer 30, and the gate electrode 40. In this example embodiment, the channel 20 forms a bit line, whereas the gate electrode 30 forms a word line.

The channel 20 may be formed of a material including, for example, at least one of silicon (Si), germanium (Ge), polysilicon, conductive carbon nano tube (CNT), nanowire, grapheme, etc.

A separation region 45 is formed between the neighboring gate electrodes 40.

As is the case with the channel 20, the ferroelectric layer 30 is formed continuously in the bit line direction, but discontinuously in the word line direction. To suppress and/or prevent interference between neighboring ferroelectric memory cells located at different word lines, a low-dielectric (low-k) region 50 is formed at a position in the ferroelectric layer 30 corresponding to each separation region 45 formed between the gate electrodes 40. Accordingly, the interference between neighboring ferroelectric memory cells may be reduced.

The low-dielectric region 50 is formed of a material capable of lowering a dielectric constant. In one example, the low-k region 50 may be a low-k implant area formed by implanting, for example, Si, Ge or the like. In another example, the low-k region 50 may be formed by etching a partial area of the ferroelectric layer 30 corresponding to the separation region 45 and then filling an etched area with a low-k material, for example, $SiO_2$, $Si_3N_4$ or the like.

Figure 3A:
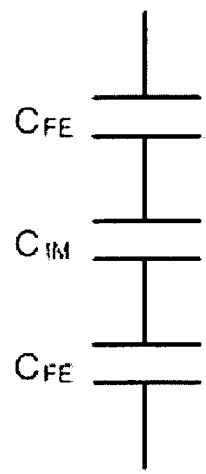
FIGS. 3A and 3B respectively illustrate a series capacitor equivalent circuit and a voltage drop of a ferroelectric layer of the ferroelectric memory device of FIG. 2.
Figure 3B:
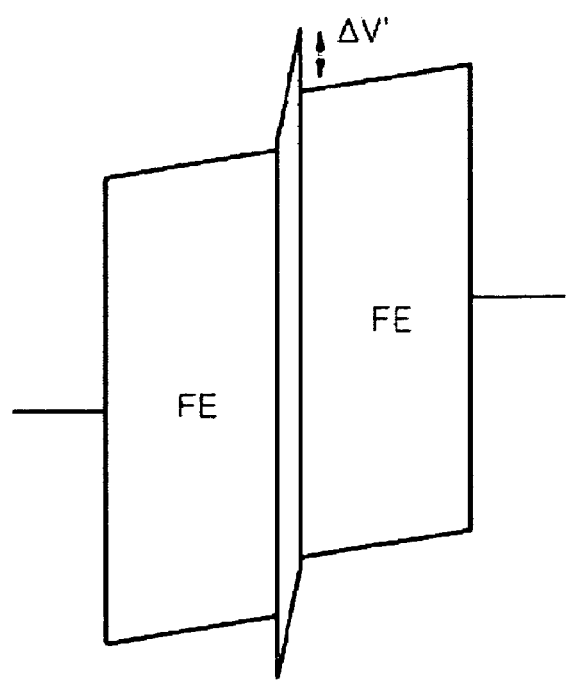

FIG. 3A illustrates a series capacitor equivalent circuit of the ferroelectric layer 30 of the ferroelectric memory device 10 of FIG. 2. With a low-k implant area formed in the ferroelectric layer 30, the ferroelectric layer 30 constitutes a series capacitor of a capacitor $C_{FE}$ by the ferroelectric layer 30—a capacitor $C_{IM}$ by the implant region—a capacitor $C_{FE}$ by the ferroelectric layer 30 in the bit line direction. Accordingly, in the ferroelectric layer 30, a voltage drop by $\Delta V'$ is generated between ferroelectric layer areas FE located at both sides of an implant area as illustrated in FIG. 3B. For example, a voltage drop is generated in the low-k region 50 between the ferroelectric memory cells. As a result, the interference between ferroelectric memory cells may be reduced.

FIG. 4 schematically illustrates a ferroelectric memory device according to another example embodiment.

The ferroelectric memory device 60 shown in FIG. 4 is similar to the ferroelectric memory device 10 of FIG. 2. However, instead of the low-k region 50 of the implant area or an area obtained by filling a low-k material in the etched area, the ferroelectric memory device 60 includes a thin screening dielectric 70 provided between the channel 20 and the ferroelectric layer 30 at an area corresponding to each separation region 45. The thin screening dielectric 70 is formed relatively close to the channel 20. The thin screening dielectric 70 may be formed of, for example, silicon oxide $SiO_2$ or the like.

Figure 5A:
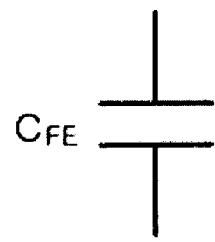
FIGS. 5A and 5B respectively illustrate a single capacitor equivalent circuit and a voltage level in an area of the ferroelectric layer for a ferroelectric memory device without a thin screening dielectric.
Figure 5B:
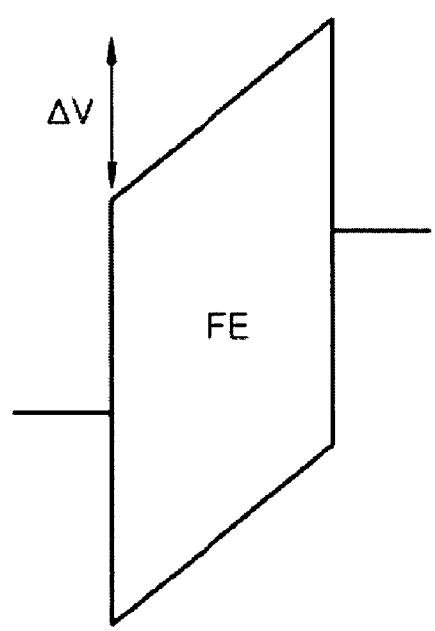

FIGS. 5A and 5B respectively illustrate a single capacitor ($C_{FE}$) equivalent circuit and a voltage level in an area of the ferroelectric layer 30 without the thin screening dielectric 70.

Figure 6A:
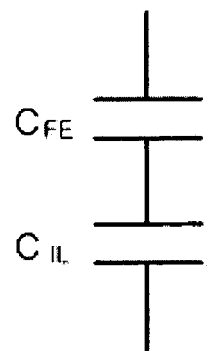
FIGS. 6A and 6B respectively illustrate a series capacitor and a voltage drop in an area of a ferroelectric layer for a ferroelectric memory device including a thin screening dielectric.
Figure 6B:
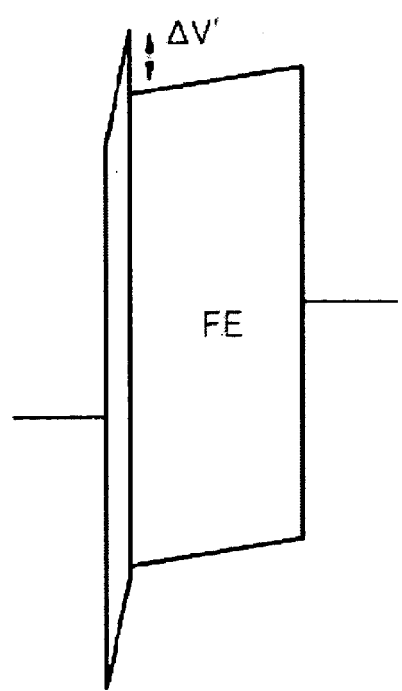

FIGS. 6A and 6B respectively illustrate a series capacitor ($C_{FE}$; $C_{IL}$) and a voltage drop in an area of the ferroelectric layer 30 including the thin screening dielectric 70.

Referring to FIG. 6A, a series capacitor of a capacitor $C_{FE}$ by the ferroelectric layer 30—a capacitor $C_{IL}$ by the thin screening dielectric 70 is constituted in the area of the ferroelectric layer 30 including the thin screening dielectric 70. Accordingly, a voltage drop by $\Delta V'$ is generated in the ferroelectric layer 30 as illustrated in FIG. 6B so that the interference between ferroelectric memory cells may be reduced.

Because the low-k region 50 is formed between the ferroelectric memory cells by implantation in the ferroelectric layer 30, or the thin screening dielectric 70 is formed at a position relatively close to the channel 20 between the ferroelectric memory cells, the ferroelectric memory devices shown in FIGS. 2 and 4 do not need an etching and/or gap filling process of the ferroelectric layer 30 to reduce interference between neighboring ferroelectric memory cells.

FIG. 7 schematically illustrates a ferroelectric memory device according to another example embodiment. The ferroelectric memory device 80 shown in FIG. 7 is similar to the ferroelectric memory device 10 shown in FIG. 2, except that the separation region 45 separates both the gate electrode 40 and a portion ferroelectric layer 30 of neighboring ferroelectric memory cells. In this example, each separation region 45 is formed to separate the neighboring ferroelectric memory cells over the gate electrode 40 and a portion of the ferroelectric layer 30.

Figure 8:
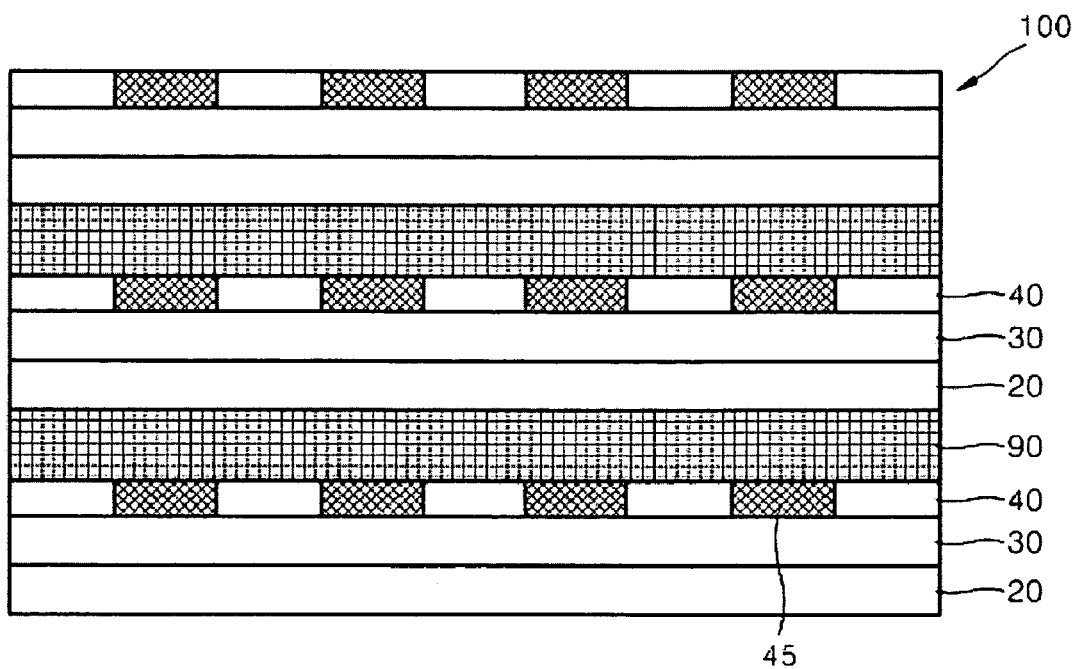
FIGS. 8 and 9 schematically illustrate stacked ferroelectric memory devices according to various example embodiments.
Figure 9:
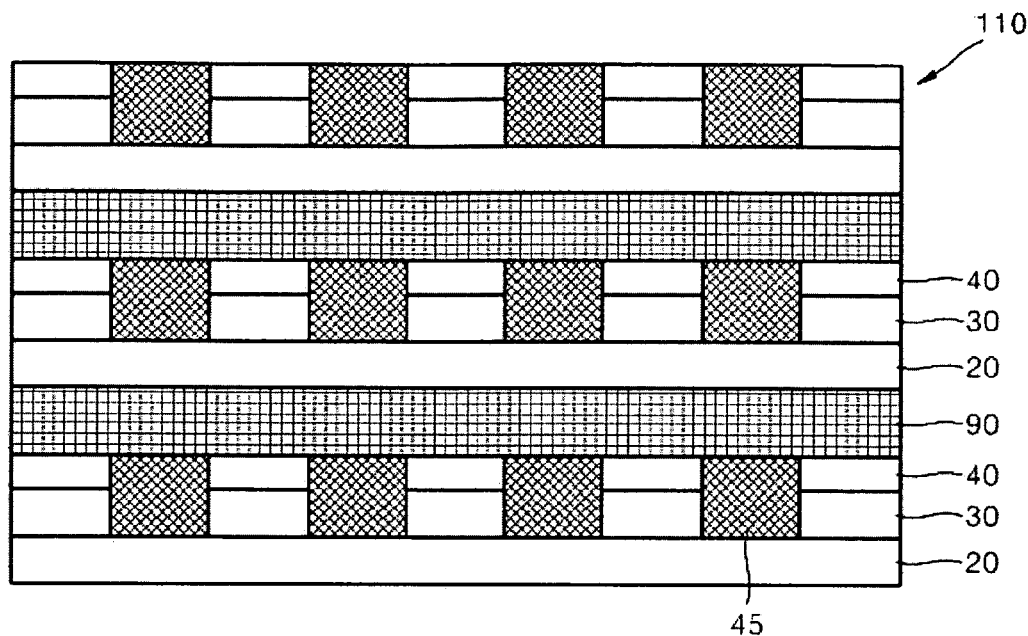

FIGS. 8 and 9 schematically illustrate a plurality of stacked ferroelectric memory devices according to various example embodiments.

FIG. 8 illustrates an example in which a plurality of ferroelectric memory cells are stacked in a multi-layer structure. In this example, the plurality of ferroelectric memory cells are arranged in a two-dimensional array of word lines and bit lines, and the ferroelectric layer 30 is formed continuously. When the ferroelectric memory cells are formed in a stack structure, a stack unit of the fully depleted channel 20, the ferroelectric layer 30, and the gate electrode 40 is repeated. A dielectric layer 90 functioning as an insulation layer is formed between each stacked unit. The low-k region 50 of FIG. 2 or the thin screening dielectric 70 of FIG. 4 may be provided to reduce interference between the ferroelectric memory cells located at neighboring word lines. In FIG. 8, the illustration of the low-k region or the thin screening dielectric is omitted.

FIG. 9 illustrates another example embodiment in which a plurality of ferroelectric memory cells are stacked in multiple layers. In this example, the plurality of ferroelectric memory cells are arranged in a two-dimensional array of word lines and bit lines, and a separation region 45 separates both gate electrodes 40 and portions of ferroelectric layers 30 of neighboring ferroelectric memory cells. When the ferroelectric memory cells are formed in a stack structure, a stack unit of the fully depleted channel 20, the ferroelectric layer 30, and the gate electrode 40 is repeated. The dielectric layer 90 functions as an insulation layer and is located between the stack units.

Figure 10:
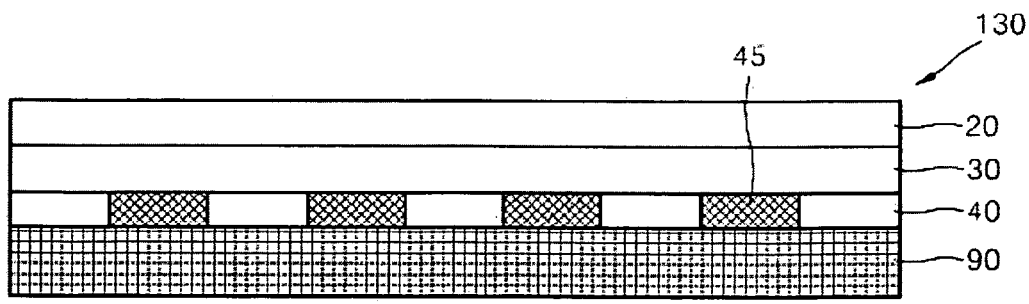
FIG. 10 schematically illustrates a ferroelectric memory device according to another example embodiment.

FIG. 10 schematically illustrates a ferroelectric memory device according to another example embodiment. The ferroelectric memory device 130 is similar to the ferroelectric memory device 10 of FIG. 2, except that the ferroelectric memory device 130 is a thin film transistor (TFT) stack type in which the channel 20 is located above the ferroelectric layer 30. The gate electrode 40 of each memory cell, which is separated by a separation region 45, is formed on the dielectric layer 90. The ferroelectric layer 30 is formed on the gate electrodes 40 and separation regions 45, and the fully depleted channel 20 is formed on the ferroelectric layer 30. The dielectric layer 90 functions as an insulation layer or a base layer.

As illustrated in FIG. 10, for example, when depositing the ferroelectric layer 30 directly on the channel 20 is relatively difficult, the ferroelectric memory device 10 may be formed to have a TFT type structure. The TFT type structure may be useful when carbon nano tube, nanowire, or graphene is used as a channel material 20.

Figure 11:
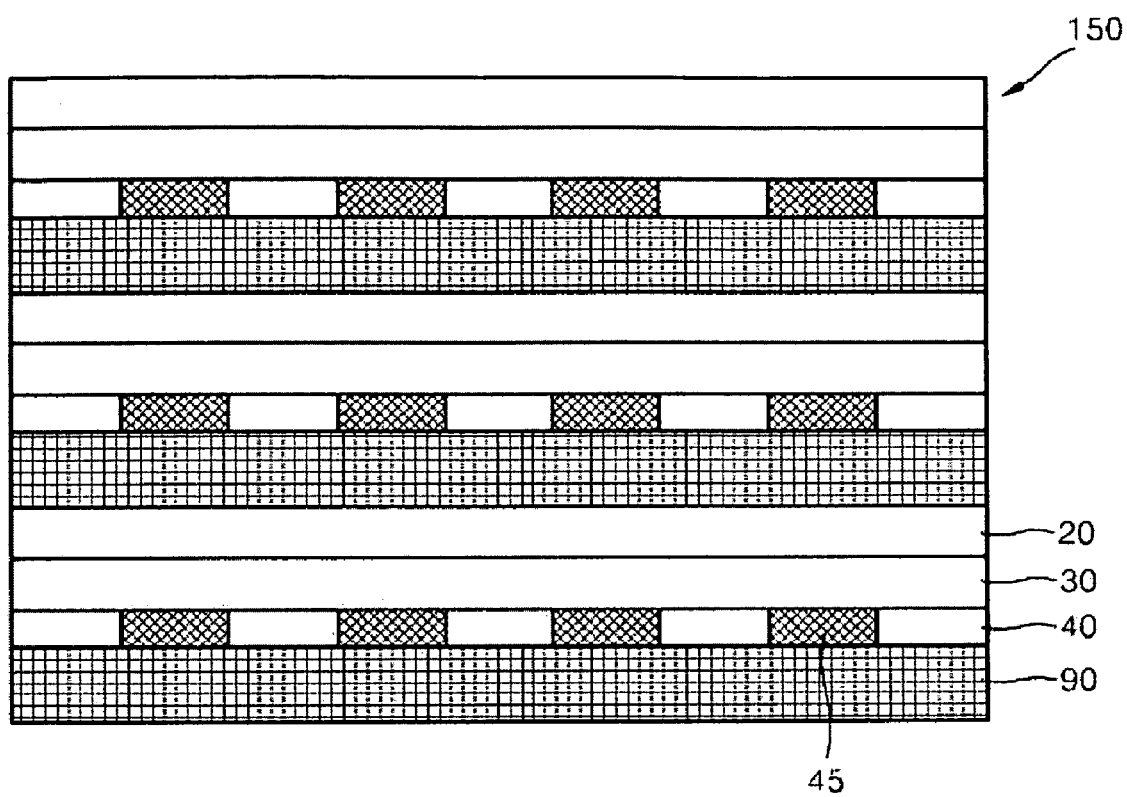
FIG. 11 illustrates a plurality of ferroelectric memory cells having a TFT stack structure where the channel is located above the ferroelectric layer as in FIG. 10 and in which the word lines and the bit lines are arranged in two dimensions.

FIG. 11 schematically illustrates a stack type ferroelectric memory device according to another example embodiment. In FIG. 11, the stack type ferroelectric memory device includes a plurality of ferroelectric memory cells having a TFT type stack structure in which a channel 20 located above the ferroelectric layer 30. The plurality of ferroelectric memory cells are arranged in two dimensions of word lines and bit lines, and stacked in multiple layers. When the ferroelectric memory cells are formed in a stack structure, the stack unit of the gate electrode 40, the ferroelectric layer 30, and the fully depleted channel 20 is repeated. The dielectric layer 90 functions as an insulation layer, and is located between the stack units.

The above-described ferroelectric memory devices having a single or multi-layer structure, according to example embodiments, are each provided with the fully depleted channel 20. These example embodiments may be used without a doping process to form the source/drain region and be capable of NAND operation without a substrate electrode, so as to be stacked in three dimensions.

When the fully depleted channel 20 is provided, the source/drain region may be limited to areas corresponding to respective ends of the ferroelectric memory cell of the channel 20 during the application of a voltage to the ferroelectric memory device due to a fringing field in a direction along the lateral side of the gate electrode 40. As a result, a separate doping process to form the source/drain region may be omitted.

Figure 12:
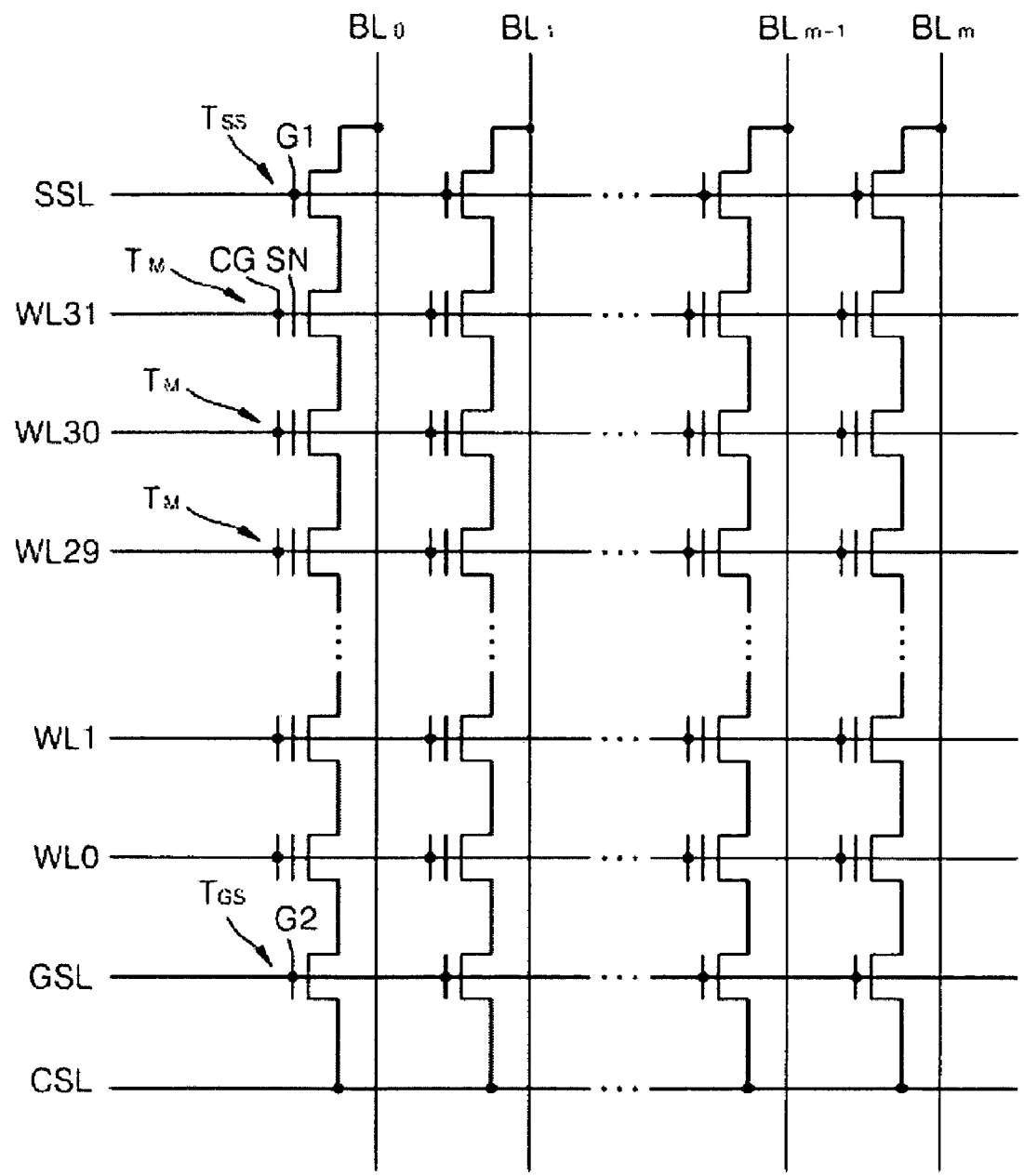
FIG. 12 is a circuit diagram showing an arrangement of ferroelectric memory apparatus, and an operating method thereof, according to example embodiments.

FIG. 12 is a circuit diagram showing an example arrangement of a ferroelectric memory apparatus, and an operating method thereof, according to an example embodiment. The ferroelectric memory apparatus according to at least this example embodiment has a NAND array structure and may include the single layer ferroelectric memory devices 10, 60, 80, or 130 of FIGS. 2, 4, 7, and 10, or the stack multi-layer ferroelectric memory devices 100, 110, or 130 of FIGS. 8, 9, and 11.

Referring FIG. 12, the ferroelectric memory apparatus includes a ferroelectric memory cell array arranged in a NAND array structure. Each of the ferroelectric memory cells of the ferroelectric memory cell array may correspond to the ferroelectric memory cell of the single layer ferroelectric memory devices 10, 60, 80, or 130 of FIG. 2, 4, 7, or 10, or the stack multi-layer ferroelectric memory devices 100, 110, or 130 of FIG. 8, 9, or 11.

In the ferroelectric memory cell array shown in FIG. 12, a plurality of bit lines $BL_0$, $BL_1$, ..., $BL_{m-1}$, and $BL_m$ are arranged in columns and a common source line CSL is arranged in a row. A string selection transistor $T_{SS}$, a plurality of memory transistors $T_M$ (also referred to herein as ferroelectric memory cells $T_M$), and a ground selection transistor $T_{GS}$ are arranged serially between each of the bit lines $BL_0$, $BL_1$, ..., $BL_{m-1}$, and $BL_m$ and the common source line CSL.

A string selection line SSL extends in a row direction to connect first gates G1 of the string selection transistors $T_{SS}$ in each column. A ground selection line GSL extends in the row direction to connect second gates G2 of the ground selection transistors $T_{GS}$ in each column. The word lines $WL_0$, $WL_1$, ..., $WL_{29}$, $WL_{30}$, and $WL_{31}$ extend in the row direction to connect gate electrodes CG of the memory transistors $T_M$. The numbers of the ferroelectric memory cells $T_M$ and the word lines $WL_0$, ..., $WL_{29}$, $WL_{30}$, and $WL_{31}$ described herein are examples only.

A storage node SN (e.g., the above-described ferroelectric layer 30) of the ferroelectric memory cells $T_M$ stores data. For example, as a threshold voltage is shifted according to the polarization direction of the ferroelectric layer 30, data may be programmed in the ferroelectric memory cells $T_M$. A method of programming data and a method of reading the data are referred to herein as methods of operating. However, as shown below in Tables 1 and 2, a pass voltage Vpass or a program voltage applied to program data on the ferroelectric memory device or read the data may be set to be lower than the voltage applied to a flash memory apparatus.

Table 1 shows, as a comparative example, a voltage applied during the NAND operation of a general flash memory apparatus. Table 2 shows a voltage applied during the NAND operation of the ferroelectric memory apparatus according to at least one example embodiment. The amount of the voltage in Table 2 is an example and the amount of an applied voltage during the program, read, or erase operation of the ferroelectric memory apparatus according to an example embodiment is not limited thereto. In Tables 1 and 2, "B/L" denotes a bit line, "W/L" denotes a word line, and "Vcc" denotes a power voltage. Also, in Table 1, "Bulk" denotes a bulk substrate itself, a bulk substrate in units of blocks, or a bulk portion on a substrate when erasing is performed in units of blocks in the flash memory apparatus.

As seen from the comparison of Tables 1 and 2, the erase operation in the ferroelectric memory apparatus according to an example embodiment is different from the case of the flash memory apparatus. The program and data read operations are similar to the case of the flash memory apparatus, except that the pass voltage Vpass or the program voltage to be applied is lower than the voltage applied to the flash memory apparatus.

During a program operation in the flash memory apparatus, a program voltage of between about 14.5V to about 18 V, inclusive, is applied to a selected word line Select W/L and a voltage of about 9 V is applied to the pass word line Pass W/L. In contrast, in a ferroelectric memory apparatus according to an example embodiment, a program voltage of about 6 V is applied to the selected word line Select W/L and a voltage of about 3 V is applied to the pass word line Pass W/L that is not selected.

During a data read operation in the flash memory apparatus, a pass voltage Vpass of about 5 V is applied to each of the string selection line SSL, the ground selection line GSL, and the pass word line Pass W/L. In contrast, in a ferroelectric memory apparatus according to an example embodiment, a pass voltage Vpass of about 1.2 V is applied to each of the string selection line SSL, the ground selection line GSL, and the pass word line Pass W/L.

Also, as shown by comparing Tables 1 and 2 and the erase method described below, in the flash memory apparatus the Bulk is grounded during the program and read operations and an erase voltage of about 20V is applied to the Bulk during the erase operation. In a ferroelectric memory apparatus according to an example embodiment, the erase operation may be performed without applying an erase voltage to the Bulk.

TABLE 1

| Operation | Erase | Program | Read |
|---|---|---|---|
| "0" B/L | Float | 0 V | Vcc |
| "1" B/L | Float | Vcc | 1 V |
| SSL | Float | Vcc | 5 V |
| GSL | Float | 0 V | 5 V |
| Select W/L | 0 V | 14.5~18 V | 0 V |
| Pass W/L | 0 V | 9 V | 5 V |
| Bulk | 20 V | 0 V | 0 V |

TABLE 2

| Operation | Erase | Program | Read |
|---|---|---|---|
| "0" B/L | Verase (~6 V) | 0 V | Vcc |
| "1" B/L | Verase (~6 V) | Vcc | 1 V |
| SSL | Verase + Vt (~6 V) | Vcc | Vpass (~1.2 V) |
| GSL | Verase + Vt (~6 V) | 0 V | Vpass (~1.2 V) |
| Select W/L | 0 V | Vprog (~6 V) | 0 V |
| Pass W/L | 0 V | Vhprog (~3 V) | Vpass (~1.2 V) |

Methods of erasing data programmed on the ferroelectric memory cells $T_M$ will be described below with reference to Table 2 and FIGS. 12-15.

Figure 13:
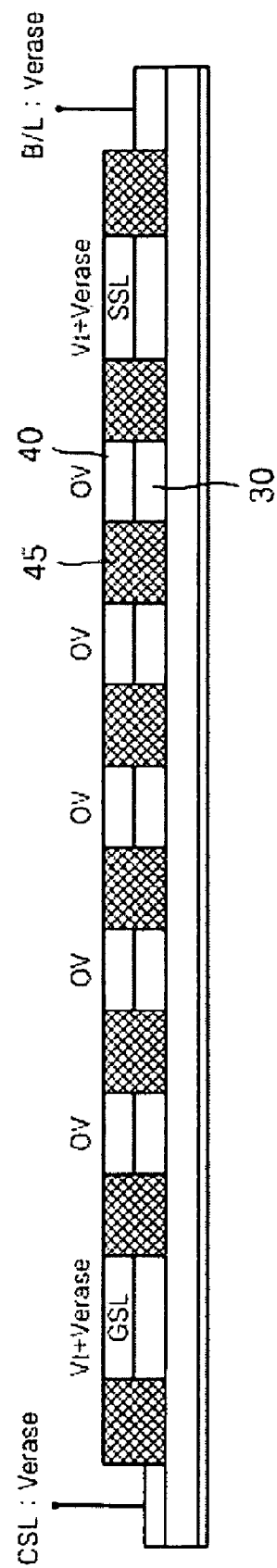
FIGS. 13 and 14 are cross-sectional views illustrating ferroelectric memory apparatuses and an erase method thereof according to example embodiments.
Figure 14:
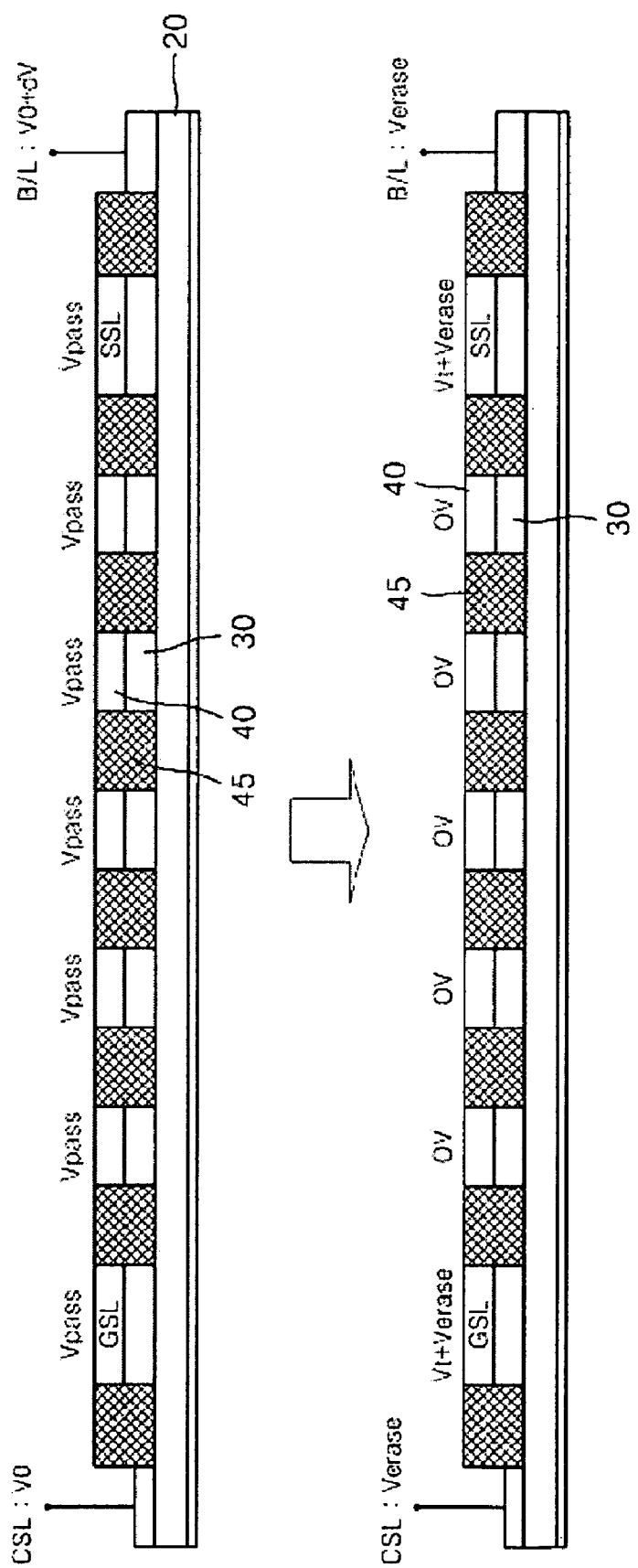
Figure 15:
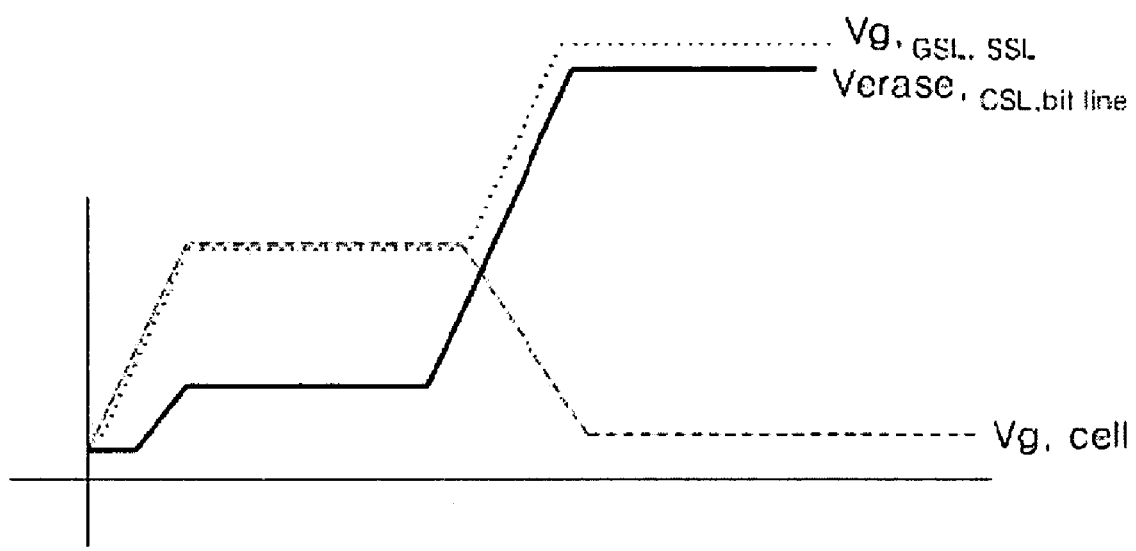
FIG. 15 is a graph showing an example change in the threshold voltage of a ferroelectric memory cell during channel inversion and data erasing in FIG. 14.

FIGS. 13 and 14 are cross-sectional views of ferroelectric memory apparatuses and an erase method thereof according to various example embodiments. FIG. 15 is a graph showing an example change in the threshold voltage of a ferroelectric memory cell during inversion of the channel 20 of FIG. 14 and a data erase operation.

FIGS. 13 and 14 illustrate example cases in which a ferroelectric memory apparatus has a structure of the ferroelectric memory device 80 of FIG. 7. The structure of the single layer ferroelectric memory device 10, 60, or 130 of FIG. 2, 4, or 10 or the structure of the multilayer ferroelectric memory device 100, 110, or 130 of FIG. 8, 9, or 11 may be applied instead of the structure of FIG. 7.

According to methods of erasing data in a ferroelectric memory apparatus according to example embodiments, a relatively high bias voltage needed for erasing is applied to the bit lines $BL_0, \ldots, BL_m$ and the common source line CSL, but not to the substrate. In addition, the relatively high bias voltage is applied to the ground selection line GSL and the string selection line SSL. Band-to-band tunneling is generated due to a strong reverse voltage between the common source line CSL and the ground selection line GSL, and thus, holes are injected in the channel 20. Accordingly, an erase voltage is applied to the overall channel so that erasing may be performed in a method similar to the method used for an existing flash memory.

In Table 2 and FIGS. 13 and 14, the relatively high bias voltages applied to the bit lines $BL_0, \ldots, BL_m$ and the common source line CSL are the same or substantially the same, and the relatively high bias voltages applied to the ground selection line GSL and the string selection line SSL are the same or substantially the same. However, example embodiments are not limited thereto and different relatively high bias voltages may be applied.

Referring to FIG. 13, an erase voltage Verase is applied to the bit lines $BL_0, \ldots, BL_m$ and the common source line CSL to erase the channel 20 of the ferroelectric memory cells $T_M$. Furthermore, an erase voltage Vt+Verase is applied to the string selection line SSL and the ground selection line GSL, while a zero voltage 0 V is applied to the word lines $WL_0, \ldots, WL_{31}$. As a result, a voltage of about 0 V is applied to the gate electrode CG 40 of the ferroelectric memory cells $T_M$. Accordingly, a relatively high electric field is induced between the gate electrode CG 40 and the channel 20 of the ferroelectric memory cells $T_M$ and the polarization direction of the ferroelectric layer 30 is changed so that the threshold voltage of each of the ferroelectric memory cells $T_M$ is shifted to an erase state and data of the ferroelectric memory cells $T_M$ is erased at the same or substantially the same time (e.g., simultaneously or concurrently).

The data erase method described with regard to FIG. 13 may be applied when silicon, polysilicon, germanium, or carbon nano tube are used as a material for the channel 20 of the ferroelectric memory cells $T_M$.

As in FIGS. 14 and 15, channel inversion may be performed before the data erase operation to promote erasing of the channel 20 of the ferroelectric memory cells $T_M$. For example, the channel 20 of the ferroelectric memory cells $T_M$ may be inverted and then the erase method of FIG. 13 may be performed.

In one example channel inversion method, a first inversion voltage V0 is applied to the common source line CSL, while a second inversion voltage V0+dV is applied to the bit lines $BL_0, BL_1, \ldots, BL_{m-1}$, and $BL_m$. Furthermore, the pass voltage Vpass is applied to the string selection line SSL and the ground selection line GSL. Then, the channel 20 is inverted such that the ferroelectric memory cells $T_M$ have a threshold voltage greater than the threshold voltage in the erase state.

After the channel 20 is inverted as described above, the erase operation may be performed as described with reference to FIG. 13. For example, the erase voltage Verase is applied to the bit lines $BL_0, BL_1, \ldots, BL_{m-1}$, and $BL_m$ and the common source line CSL. Furthermore, the erase voltage Vt+Verase is applied to the string selection line SSL and the ground selection line GSL and the zero voltage 0 V is applied to the word lines $WL_0, \ldots, WL_{31}$. The threshold voltage of the ferroelectric memory cells $T_M$ is then shifted to an erase state.

The data erase method of FIG. 14 may be applied when a wideband material (e.g., a wideband oxide based material such as ZnO based or GIZO material), which is relatively difficult to be applied directly to the data erase method of FIG. 13, is used as a material for the channel 20 of the ferroelectric memory cells $T_M$. Also, even when silicon, germanium, or carbon nano tube is used as a material for the channel 20 of the ferroelectric memory cells $T_M$, the data erase method of FIG. 14 may be applied in which data is erased after the channel inversion is performed.

In data erase methods according to example embodiments described with reference to FIGS. 13 and 14, the erase voltage Verase applied to the bit lines $BL_0, BL_1, \ldots, BL_{m-1}, BL_m$ and the common source line CSL and the erase voltage Verase+Vt applied to the string selection line SSL and the ground selection line GSL may generate band-to-band tunneling between the ferroelectric memory cells $T_M$. In this case, junction breakdown is generated between the source and drain of each of the ferroelectric memory cells $T_M$ so that the band-to-band tunneling is generated. The erase voltages Verase and Verase+Vt may be different from each other, the same or substantially the same as each other and may have a range of, for example, about 5 V to 6 V, inclusive.

Ferroelectric memory apparatuses having a fully depleted channel 20 according to example embodiments may use an operation voltage that is lower than that of a general NAND flash memory. For example, while the general NAND flash memory uses an operation voltage of about 20 V for erasing, ferroelectric memory apparatuses according to example embodiments use a relatively lower operation voltage of between about 5 V to about 6 V, inclusive, for erasing.

During the channel inversion discussed with regard to FIG. 14, the pass voltage Vpass may be applied to the word lines $WL_0, WL_1, \ldots, WL_{29}, WL_{30}, WL_{31}$, the string selection line SSL, and the ground selection line GSL, the first inversion voltage V0 may be applied to the common source line CSL, and the second inversion voltage V0+dV may be applied to the bit lines $BL_0, BL_1, \ldots, BL_{m-1}, BL_m$. The first inversion voltage V0 and the second inversion voltage V0+dV may be different from each other, the same or substantially the same as each other. Then, the channel 20 is solidified and the channel inversion is generated thereby facilitating channel erasing.

According to methods of operating ferroelectric memory apparatuses according to example embodiments, the data erase operation may be performed without applying a relatively high voltage to the gate electrode CG 40.

As described above, in ferroelectric memory apparatuses according to example embodiments, because the source/drain region is defined by the fringing field in the lateral direction of the gate electrode 40 of each of the ferroelectric memory cells $T_M$, the source/drain region is formed by the fringing field before performing the erase operation. Thereafter, the channel 20 may be turned on and the erase operation may be performed.

According to the above-described erase method, the data erase operation may be performed without applying a body bias to the ferroelectric memory device 10 (e.g., without applying an erase voltage via the substrate). Thus, the ferroelectric memory device 10 may extend to a stack structure and data may be more reliably erased using the above-described erase methods without the body bias.

Figure 16:
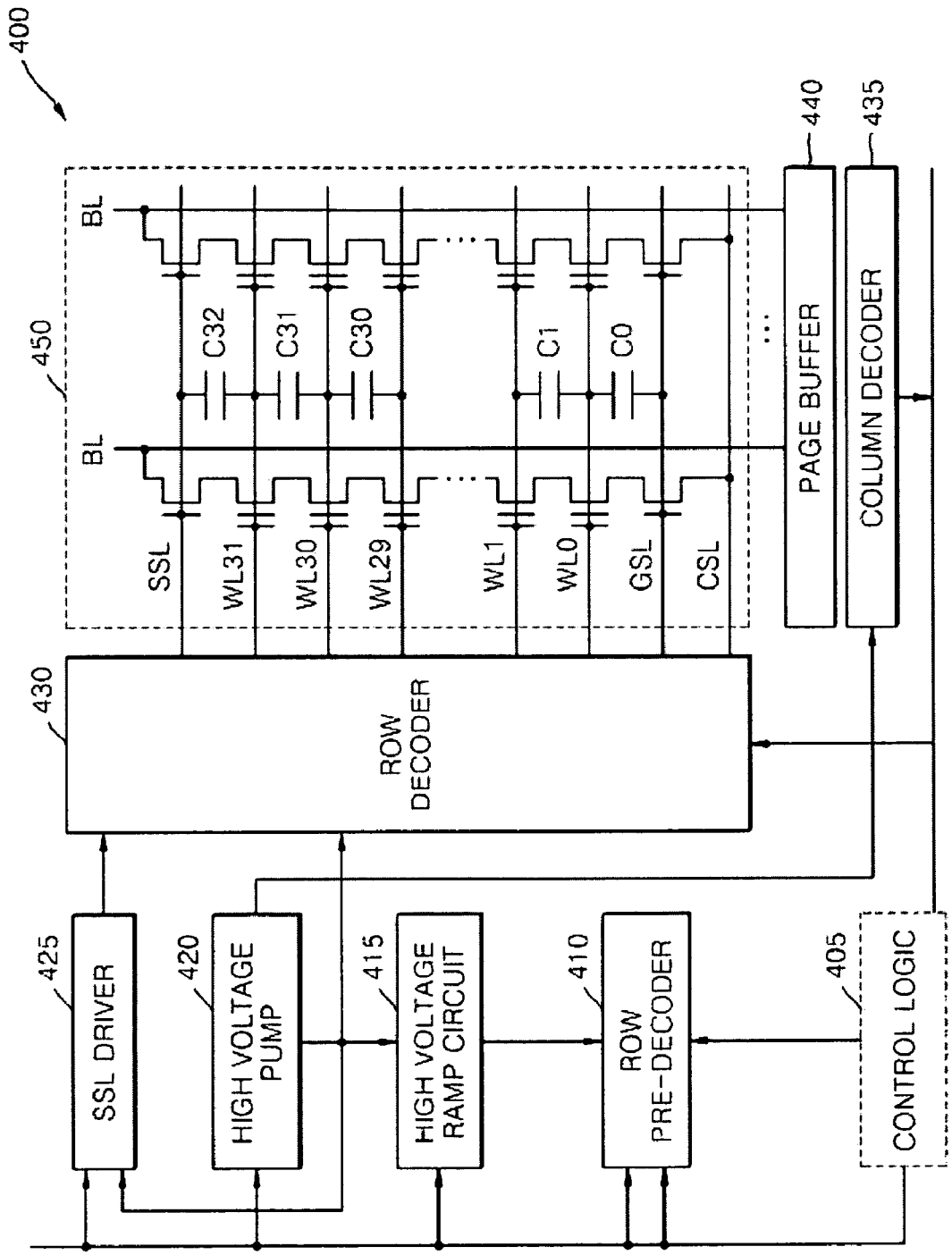
FIG. 16 is a block diagram of a ferroelectric memory apparatus according to another example embodiment.

FIG. 16 is a block diagram of a ferroelectric memory apparatus 400 according to another example embodiment.

Referring to FIG. 16, a NAND ferroelectric memory cell array 450 may correspond to the NAND ferroelectric memory apparatus of FIG. 12. Further, the NAND ferroelectric memory cell array 450 may have a NAND type structure of the single layer ferroelectric memory device 10, 60, 80, or 130 described with reference to FIG. 2, 4, 7, or 10 or the stack multi-layer ferroelectric memory device 100, 110, or 130 described with reference to FIG. 8, 9, or 11. Also, the NAND ferroelectric memory cell array 450 may erase data using the erase method described with reference to FIGS. 13-15.

In the NAND ferroelectric memory cell array 450, the string selection line SSL, the word lines $WL_0, WL_1, \ldots, WL_{29}, WL_{30}, WL_{31}$, the ground selection line GSL, and the common source line CSL are connected to a row decoder 430. The bit lines BL of the NAND ferroelectric memory cell array 450 are connected to a page buffer 440 and a column decoder 435.

In example operation, the row decoder 430 receives a signal through an SSL driver 425, a high voltage pump 420, a high voltage ramp circuit 415, and a row pre-decoder 410. An erase voltage is supplied from the high voltage pump 420 to the common source line CSL via the row decoder 430. A control logic 405 controls the SSL driver 425, the high voltage pump 420, the high voltage ramp circuit 415, and the row pre-decoder 410.

Unlike a general flash memory apparatus, in the example embodiment shown in FIG. 16, the high voltage pump 420 may be further connected to the column decoder 435. Accordingly, in the erase operation, the erase voltage is supplied from the high voltage pump 420 to the bit lines BL via the column decoder 435. Therefore, the ferroelectric memory apparatus 400 need not include an additional high voltage generation apparatus compared to a general flash memory apparatus.

As described above, according to example embodiments, interference between ferroelectric cells may be reduced, scalability may be increased and/or a structure without a substrate electrode may be realized so that a stack type memory device may be implemented.

Figure 17:
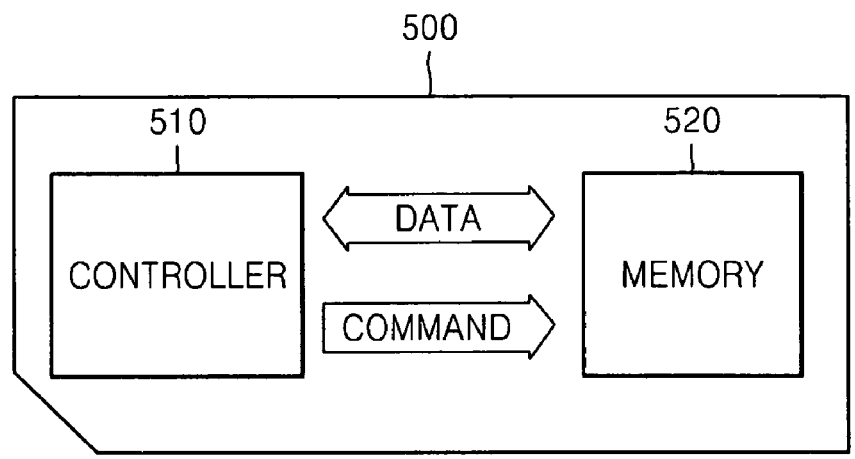
FIG. 17 is a schematic diagram roughly illustrating a memory card according to example embodiments.

FIG. 17 is a schematic diagram illustrating a memory card 500 according to example embodiments.

Referring to FIG. 17, a controller 510 and a memory 520 may exchange electric signals. For example, according to commands of the controller 510, the memory 520 and the controller 510 exchange data. Accordingly, the memory card 500 may either store data in the memory 520 or output data from the memory 520. The memory 520 may include one of the memory devices described above in reference to FIGS. 2, 4, 7, 8, 9, 10 and 11.

Such a memory card 500 may be used as a storage medium for various portable electronic devices. For example, the memory card 500 may be a multimedia card (MMC) or a secure digital (SD) card.

Figure 18:
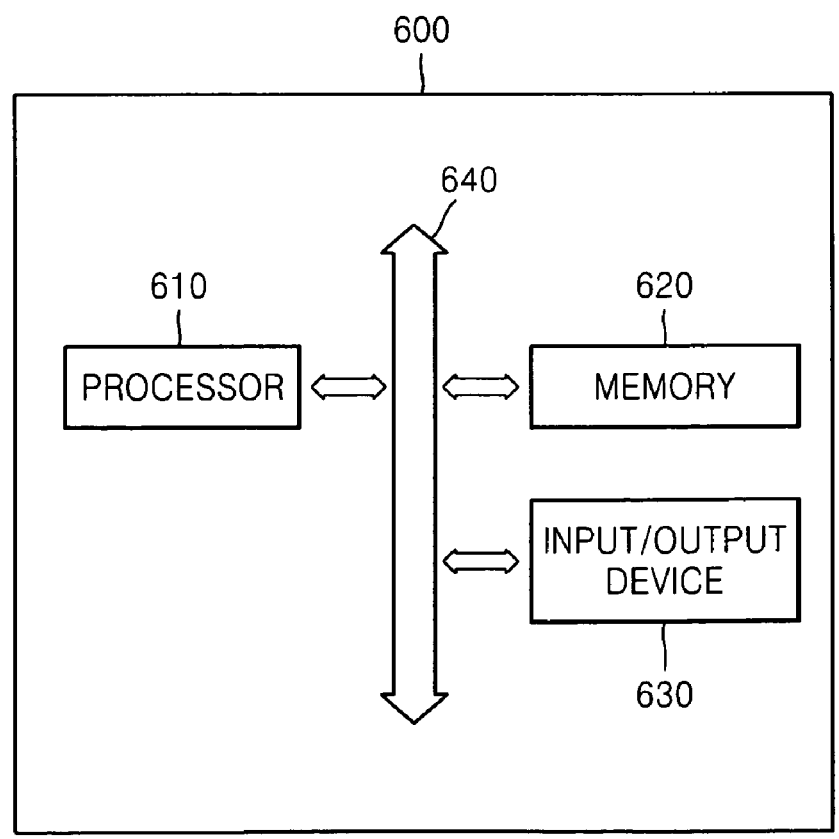
FIG. 18 is a block diagram roughly illustrating an electronic system according to example embodiments.

FIG. 18 is a block diagram roughly illustrating an electronic system 600 according to example embodiments.

Referring to FIG. 18, a processor 610, an input/output device 630, and a memory 620 perform data communication with each other via a bus 640. The processor 610 may execute a program and control the electronic system 600. The input/output device 630 may be used to input/output data to/from the electronic system 600. The electronic system 600 may be connected to an external device, for example, a personal computer or a network, by using the input/output device 630 and may exchange data with the external device.

The memory 620 may store codes or programs for operations of the processor 610. For example, the memory 620 may include one of the non-volatile memory devices described above in reference to FIGS. 2, 4, 7, 8, 9, 10 and 11.

For example, such an electronic system 600 may embody various electronic control systems requiring the memory 620, and, for example, may be used in mobile phones, MP3 players, navigation devices, solid state disks (SSD), or household appliances.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A ferroelectric memory device having a NAND array of a plurality of ferroelectric memory cells, each of the plurality of ferroelectric memory cells comprising:
    a fully depleted channel layer;
    a gate electrode;
    a ferroelectric layer located between the channel layer and the gate electrode;
    a separation region between gate electrodes of each pair of neighboring memory cells; and
    a dielectric region to reduce interference between the plurality of ferroelectric memory cells, the dielectric region being located between the channel layer and the ferroelectric layer in an area corresponding to each separation region.

2. The ferroelectric memory device of claim 1, wherein each of the plurality of memory cells corresponds to a unit area including the channel layer, the ferroelectric layer, and the gate electrode, wherein the ferroelectric layer is formed as a continuous layer relative to the plurality of memory cells, and wherein the dielectric region includes a thin screening dielectric for reducing the interference between the memory cells, the thin screening dielectric being located between the channel layer and the ferroelectric layer in the area corresponding to each separation region.

3. The ferroelectric memory device of claim 2, wherein the channel layer and a gate electrode layer cross each other in a plurality of areas, the channel layer extends along a bit line, the gate electrode layer extends along a word line, the ferroelectric layer is formed continuously along the bit line, and each of the plurality of the memory cells corresponds to the area where the channel layer and the gate electrode layer cross each other.

4. The ferroelectric memory device of claim 1, wherein each of the plurality of memory cells corresponds to a unit area including the channel layer, the ferroelectric layer, and the gate electrode, wherein the ferroelectric layer is formed continuously relative to the plurality of memory cells and wherein the dielectric region includes a low-dielectric region to reduce the interference between the neighboring memory cells, the low-dielectric region being formed in the ferroelectric layer at a position corresponding to each separation region.

5. The ferroelectric memory device of claim 4, wherein the low-dielectric region is formed by filling a part of the ferroelectric layer with a low-dielectric material or implanting a material capable of lowering a dielectric constant into the ferroelectric layer.

6. The ferroelectric memory device of claim 4, wherein the channel layer and a gate electrode layer cross each other in a plurality of areas, the channel layer forms a bit line, the gate electrode layer forms a word line, the ferroelectric layer is formed continuously along the bit line, and each memory cell corresponds to the area where the channel layer and the gate electrode layer cross each other.

7. The ferroelectric memory device of claim 1, wherein the channel layer is formed of at least one of silicon (Si), germanium (Ge), polysilicon, conductive oxide, carbon nano tube (CNT), nanowire, and graphene.

8. A memory card, comprising:
    a controller; and
    a memory connected to the controller, the memory including the ferroelectric memory device of claim 1.

9. An electronic system, comprising:
    a processor;
    an input/output device;
    a memory including the ferroelectric memory device of claim 1; and
    a bus connecting the processor, the input/output device and the memory.

10. A ferroelectric memory device having a NAND array of a plurality of ferroelectric memory cells, the device comprising:
    a fully depleted channel layer;
    a gate electrode layer; and
    a ferroelectric layer located between the channel layer and the gate electrode layer; wherein
        each of the plurality of memory cells corresponds to a unit area including the channel layer, a portion of the ferroelectric layer, and a gate electrode, and
    the device further includes,
        a separation region formed between each pair of neighboring memory cells, the separation region separating the portions of the ferroelectric layer of each pair of neighboring memory cells and separating the gate electrode of each pair of neighboring memory cells.

11. The ferroelectric memory device of claim 10, wherein the channel layer and the gate electrode layer cross each other in a plurality of areas, the channel layer extends along a bit line, the gate electrode layer extends along a word line, and each of the plurality of the memory cells corresponds to an area where the channel layer and the gate electrode layer cross each other.

12. The ferroelectric memory device of claim 1, wherein the channel layer, a gate electrode layer, and the ferroelectric layer are stacked sequentially in order of the channel layer, the ferroelectric layer, and the gate electrode layer, or the gate electrode layer, the ferroelectric layer, and the channel layer, and wherein the channel layer, the ferroelectric layer, and the gate electrode layer are arranged in one of a single layer and a multi-layer structure.

13. A method of operating a ferroelectric memory device having a plurality of ferroelectric memory cells arrayed in a NAND structure, the ferroelectric memory cells including a fully depleted channel layer, a gate electrode, a ferroelectric layer located between the channel layer and the gate electrode, a separation region formed between the gate electrodes of each pair of neighboring memory cells, and a dielectric region to reduce interference between the plurality of ferroelectric memory cells, wherein the dielectric region is located between the channel layer and the ferroelectric layer in an area corresponding to each separation region, and wherein the ferroelectric memory device further includes a string selection transistor between a bit line and a common source line, and a ground selection transistor, the method comprising:
    erasing data of the plurality of ferroelectric memory cells by applying a first erase voltage to the bit line and the common source line and applying a second erase voltage to a string selection line and a ground selection line.

14. The method of claim 13, wherein each of the plurality of memory cells corresponds to a unit area including the channel layer, the ferroelectric layer, and the gate electrode, wherein the ferroelectric layer is formed continuously relative to the plurality of memory cells, and wherein the dielectric region includes a thin screening dielectric for reducing the interference between the memory cells, the thin screening dielectric being located between the channel layer and the ferroelectric layer in the area corresponding to each separation region.

15. The method of claim 13, wherein each of the plurality of memory cells corresponds to a unit area including the channel layer, the ferroelectric layer, and the gate electrode, wherein the ferroelectric layer is formed continuously with respect to the plurality of memory cells, and wherein the dielectric region includes a low-dielectric region to reduce the interference between the neighboring memory cells, the low-dielectric region being formed in the ferroelectric layer at positions corresponding to each separation region.

16. The method of claim 15, wherein the low-dielectric region is formed by filling a part of the ferroelectric layer with a low-dielectric material or implanting a material capable of lowering a dielectric constant into the ferroelectric layer.

17. The method of claim 13, further comprising:
inverting the channel layer by applying first and second inversion voltages to the bit line and the common source line and applying a pass voltage to the string selection line and the ground selection line; and
erasing data of the plurality of ferroelectric memory cells after inverting the channel layer.

18. The method of claim 17, wherein the pass voltage is applied to the plurality of ferroelectric memory cells while inverting the channel layer.

19. The method of claim 13, wherein the erasing of data comprises:
applying a ground voltage to the plurality of ferroelectric memory cells.

20. The method of claim 13, wherein the channel layer, a gate electrode layer, and the ferroelectric layer are sequentially deposited in order of the channel layer, the ferroelectric layer, and the gate electrode layer, or the gate electrode layer, the ferroelectric layer, and the channel layer, and wherein the channel layer, the ferroelectric layer, and the gate electrode layer are arranged in one of a single layer and a multi-layer structure.

21. The method of claim 13, wherein the channel layer is formed of at least one of silicon (Si), germanium (Ge), polysilicon, conductive oxide, carbon nano tube (CNT), nanowire, and graphene.

22. A method of operating a memory card including a controller and a memory, the method comprising:
the method of operating the ferroelectric memory device of claim 13.

23. A method of operating an electronic system including a processor, an input/output device, a memory, and a bus, the bus connecting the processor, the input/output device, and the memory, the method comprising:
the method of operating the ferroelectric memory device of claim 13.

24. A method of operating a ferroelectric memory device having a plurality of ferroelectric memory cells arrayed in a NAND structure, the ferroelectric memory cells including a fully depleted channel layer, a gate electrode layer, and a ferroelectric layer located between the channel layer and the gate electrode layer, wherein the ferroelectric memory device further includes a string selection transistor between a bit line and a common source line, and a ground selection transistor, the method comprising:
erasing data of the plurality of ferroelectric memory cells by applying a first erase voltage to the bit line and the common source line and applying a second erase voltage to a string selection line and a ground selection line, wherein
each of the plurality of memory cells corresponds to a unit area including the channel layer, a portion of the ferroelectric layer, and a gate electrode, and the device further includes
a separation region formed between each pair of neighboring memory cells, the separation region separating the portions of the ferroelectric layer of each pair of neighboring memory cells and separating the gate electrodes of each pair of neighboring memory cells.

* * * * *